United States Patent
Thiagarajan et al.

(10) Patent No.: US 9,473,144 B1
(45) Date of Patent: Oct. 18, 2016

(54) INTEGRATED CIRCUIT DEVICE WITH PROGRAMMABLE ANALOG SUBSYSTEM

(71) Applicant: Cypress Semiconductor Corporation, San Jose, CA (US)

(72) Inventors: Eashwar Thiagarajan, Bellevue, WA (US); Harold M. Kutz, Edmonds, WA (US); Hans Klein, Pleasanton, CA (US); Jaskarn Singh Johal, Mukilteo, WA (US); Jean-Paul Vanitegem, San Jose, CA (US); Kendall V. Castor-Perry, Seattle, WA (US); Mark E. Hastings, Mukilteo, WA (US); Amsby D. Richardson, Jr., Lynnwood, WA (US); Anasuya Pai Maroor, Woodinville, WA (US); Ata Khan, Saratoga, CA (US); Dennis R. Seguine, Temecula, CA (US); Onur Ozbek, Lynnwood, WA (US); Carl Ferdinand Liepold, San Jose, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/670,295

(22) Filed: Mar. 26, 2015

Related U.S. Application Data

(60) Provisional application No. 62/084,142, filed on Nov. 25, 2014.

(51) Int. Cl.
*H03K 19/177* (2006.01)
(52) U.S. Cl.
CPC .............................. *H03K 19/17736* (2013.01)
(58) Field of Classification Search
CPC ................. H03K 19/17736; H03K 19/17728; H03K 19/1776; H03K 19/1773; H03K 19/17796

USPC ...................... 326/37–41, 47; 340/1.1–16.1; 327/564–566
See application file for complete search history.

(56) References Cited

U.S. PATENT DOCUMENTS

| | | | |
|---|---|---|---|
| 5,338,970 | A | 8/1994 | Boyle et al. |
| 6,636,124 | B1 * | 10/2003 | Liu ............................. 332/109 |
| 6,806,771 | B1 | 10/2004 | Hildebrandt et al. |
| 8,111,097 | B1 * | 2/2012 | Kutz et al. ........................ 330/9 |
| 8,176,296 | B2 * | 5/2012 | Snyder ............................ 712/32 |
| 8,299,850 | B1 | 10/2012 | Kutz et al. |
| 8,416,113 | B1 * | 4/2013 | Vanitegem et al. .......... 341/155 |
| 8,487,655 | B1 * | 7/2013 | Kutz et al. ...................... 326/86 |
| 8,547,135 | B1 | 10/2013 | Yarlagadda et al. |
| 8,659,317 | B1 | 2/2014 | Mohammed et al. |
| 8,717,070 | B1 * | 5/2014 | Klein et al. ................... 327/108 |
| 8,816,890 | B1 | 8/2014 | Vanitegem et al. |

(Continued)

OTHER PUBLICATIONS

Cypress Semiconductor Corporation, Datasheet: Programmable System-on-Chip (PSoC) PSoC 5LP: CY8C58LP Family, Dec. 2012.
Cypress Semiconductor Corporation, Datasheet: Programmable System-on-Chip (PSoC) PSoC 3: CY8C38 Family, Sep. 2012.
International Search Report for International Application No. PCT/2015/061654 dated Feb. 5, 2016; 2 pages.

(Continued)

*Primary Examiner* — Dylan White

(57) ABSTRACT

An integrated circuit (IC) device can include a plurality of analog blocks, including at least one fixed function analog circuit, a plurality of reconfigurable analog circuit blocks, at least one analog routing block reconfigurable to provide signal paths between any of the analog blocks; and a digital section comprising digital circuits; wherein each analog block includes dedicated of signal lines coupled to the at least one analog routing block.

17 Claims, 10 Drawing Sheets

(56) References Cited

U.S. PATENT DOCUMENTS

2009/0153152 A1* 6/2009 Maharyta et al. ............ 324/684
2010/0244894 A1   9/2010 Beal et al.
2010/0281145 A1* 11/2010 Sullam et al. ................ 709/221
2011/0026519 A1*  2/2011 Sullam ................ G06F 13/4022
                                                    370/360

OTHER PUBLICATIONS

Written Opinion of the International Searching Authority for International Application No. PCT/US2015/061654 dated Feb. 5, 2016; 6 pages.

* cited by examiner

INTEGRATED CIRCUIT DEVICE WITH PROGRAMMABLE ANALOG SUBSYSTEM

CROSS-REFERENCE TO RELATED APPLICATIONS

This application claims the benefit of U.S. Provisional Patent Application Ser. No. 62/084,142 filed on Nov. 25, 2014, the contents of which are incorporated by reference herein.

TECHNICAL FIELD

The present disclosure relates generally to integrated circuit (IC) devices having programmable blocks, and more particularly to IC devices having programmable analog circuit blocks.

BACKGROUND

Integrated circuit (IC) devices can include both fixed function circuits and reconfigurable circuits. Programmable logic devices are well known and can enable an IC device to be reconfigured into a wide range of digital functions.

IC devices providing reconfigurable analog circuits are enjoying increased popularity in addressing analog applications. In some conventional approaches, configuration data for reprogrammable analog circuits is loaded into storage circuits (e.g., registers) to establish a desired analog function. A drawback to such arrangements can be to time/effort involved in reconfiguring circuits between different functions.

While systems with configurable analog circuits are known, such conventional systems can lack the ability to accommodate multiple operating domains (e.g., continuous time, discrete time, purely digital) needed in many mixed signal applications.

DETAILED DESCRIPTION

Various embodiments will now be described that show integrated circuit (IC) devices that can interconnect analog circuit blocks together with an analog switching fabric to enable a wide variety of configurations. Analog circuit blocks can each have dedicated signal lines connected to the analog switching fabric to enable any one analog block to be connected any of the others. A switching fabric can include shielded signal paths. Analog circuit blocks can include fixed function analog circuits and reconfigurable analog circuit blocks. In some embodiments, some analog circuit blocks can have direct signal lines between physical connections of the IC device in addition to reconfigurable paths.

In some embodiments, the analog circuit blocks and analog switching fabric can be controlled and/or configured with digital signals output from a digital interface. Further, such digital signals can enable static and/or dynamic control/ configuration of the analog circuit blocks.

In some embodiments, an analog circuit block can include a programmable reference block (PRB) circuit that can generate multiple, programmable reference values, such as reference voltages and/or reference currents. A PRB circuit can have reference signal lines to supply the reference values directly to some or all other analog circuit blocks.

Figure 1:
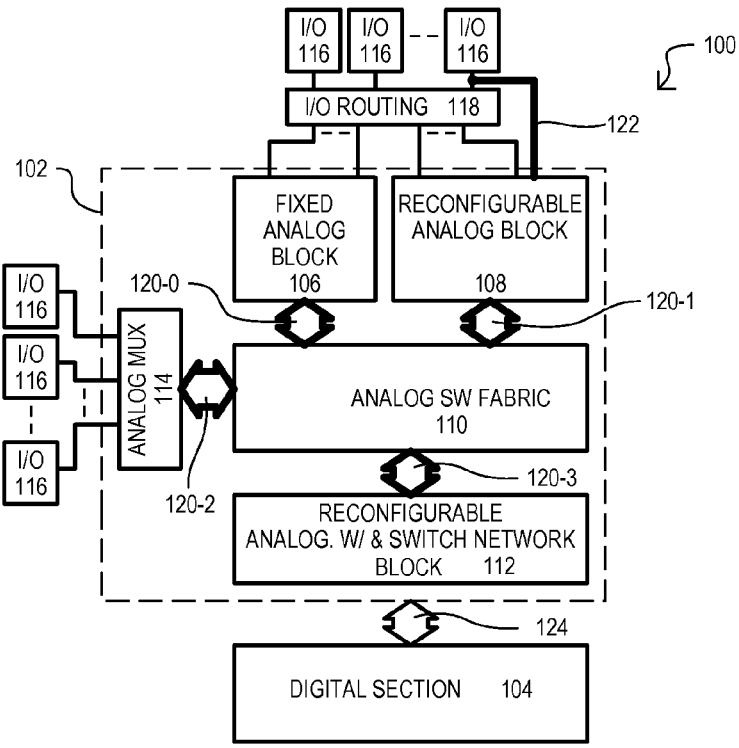
FIG. 1 is a block schematic diagram of an integrated circuit (IC) device according to an embodiment having multiple reconfigurable analog blocks with dedicated signal lines to an analog switch fabric.

FIG. 1 is a block schematic diagram of an IC device 100 according to an embodiment. An IC device 100 can include multiple analog circuit blocks, each having dedicated signal lines connected to a reconfigurable analog routing fabric. Analog circuit blocks can include fixed function analog circuits as well as reconfigurable analog circuit blocks. In some embodiments, one or more analog circuit blocks can have one or more direct signal paths to an external connection (e.g., pin) of the IC device. An IC device 100 can include an analog section 102 and a digital section 104, which can be integrated in a same IC substrate or package.

An analog section 102 can include a fixed function analog circuit block 106, reconfigurable analog blocks 108, 112, 114, and an analog switching fabric 110. An IC device 100 can receive input signals and provide output signals via input/outputs (I/Os) 116. Any of I/Os 116 can be connected to analog section 102 via a reconfigurable I/O routing 118.

Both fixed function analog circuit block 106 and reconfigurable analog blocks 108, 112, 114 can have dedicated signal lines 120-0 to -3 with direct connections to analog switching fabric 110. That is, dedicated signal lines (120-0 to -3) may not include programmable switches, or other structures that must be configured to enable a connection to analog switching fabric 110. Dedicated signal lines (120-0 to -3) can serve as unidirectional signal paths, bi-directional signal paths, or combinations thereof.

A fixed analog circuit block 106 can include one or more analog circuits having a fixed function. In some embodiments, a fixed analog circuit block 106 can include a data conversion circuit, including but not limited to an analog-to-digital converter (ADC). In particular embodiments, a fixed analog circuit block 106 can include a successive-approximation register (SAR) type ADC circuit.

In the embodiment of FIG. 1, configurable analog circuit blocks can include a first type reconfigurable analog circuit block 108, a reconfigurable analog circuit with switching network 112, and an analog multiplexer (MUX) 114.

In particular embodiments, a first type reconfigurable analog circuit block 108 can include amplifier circuits that can be reconfigured into various analog circuits. In some embodiments, such amplifiers can be operational amplifiers (op amps) which can be reconfigured into numerous circuits, including but not limited to single-stage and multi-staged op amp based circuits with various feedback configurations, filters, comparators, or buffers, to name only a few. A first type reconfigurable analog circuit block 108 can have built-in passive circuit components having configurable connections to other circuit components and/or it can be connected to passive circuit components via I/Os 116 or other connections (not shown) to the IC device 100. A first type reconfigurable analog circuit block 108 can be conceptualized as a "continuous-time" circuit block, as analog operations can occur in a continuous time domain.

A reconfigurable analog circuit with switching network 112 can include analog circuits with an accompanying switching network. Such a switching network can include switches connected to nodes that can be controlled by different clock signals, individually or in groups. Such an arrangement can enable the formation of switched-capacitor type circuits. In particular embodiments, a reconfigurable analog circuit with switching network 112 can include op amps with reconfigurable connections to a switched capacitor network. As in the case of reconfigurable analog circuit block 108, a reconfigurable analog circuit with switching network 112 can have built-in passive circuit components having configurable connections to other circuit components and/or it can be connected to passive circuit components via I/Os 116 or other connections to the IC device. A reconfigurable analog circuit with switching network 112 can be conceptualized as a "discrete-time" circuit block, as analog operations can occur in a discrete time domain when a switching network is employed.

Analog MUX 114 can selectively connect some or all of I/Os 116 to analog switching fabric 110. In some embodiments, analog MUX 114 can provide one or more direct connections to fixed analog circuit block 106.

An analog switching fabric 110 can include a reconfigurable routing network that can connect any of the analog blocks (106, 108, 112, 114) to one another via corresponding dedicated signal lines (120-0 to -3). In some embodiments, all or a portion of the conductive lines included within analog switching fabric 110 can be shielded lines. A shielded line can include an adjacent shielding conductive structure that can be maintained at a shielding potential. In some embodiments, a shielding conductive structure can surround conductive lines of analog switching fabric 110.

In some embodiments, any of analog blocks (106, 108, 112, 114) can include one or more direct signal line connections to an I/O 116. One such signal line is shown as direct I/O path 122 from first type reconfigurable analog circuit block 108 and an I/O 116. Direct I/O path 122 may not include programmable switches, or other structures that must be configured to enable a connection to I/O 116. Direct I/O paths (e.g., 122) can serve as unidirectional signal paths, bi-directional signal paths, or combinations of both.

Referring still to FIG. 1, a digital section 104 can include digital circuits, including various digital circuit blocks. It is understood that digital section signal lines 124 can be connected to any of the blocks (106,108, 112, 114) or the analog switching fabric 110 within analog section 102. In some embodiments, a digital section can include one or more reconfigurable digital blocks. In particular embodiments, a digital section can provide control signals for configuring/controlling operations of any or all analog circuit blocks (106, 108, 112, 114) or the analog switching fabric 110. Such control signals can be static or dynamic. Further, while such control signals can enable/disable switches to configure how circuit elements are connected to one another, such control signals can also control how operations are executed by circuit components.

Digital section 104 can also include digital circuits which can be configured into a signal processing path that contain any of the other circuits functioning in a different processing domain. This can enable numerous mixed signal processing configurations. In particular, there can be any permutation of continuous time domain processing (via first type reconfigurable analog circuit block 108), discrete time processing (via reconfigurable analog circuit block with switch network 112), and digital processing (via digital section 104).

In this way, an IC device can include dedicated output lines from analog circuit blocks into an analog switching fabric.

Figure 2:
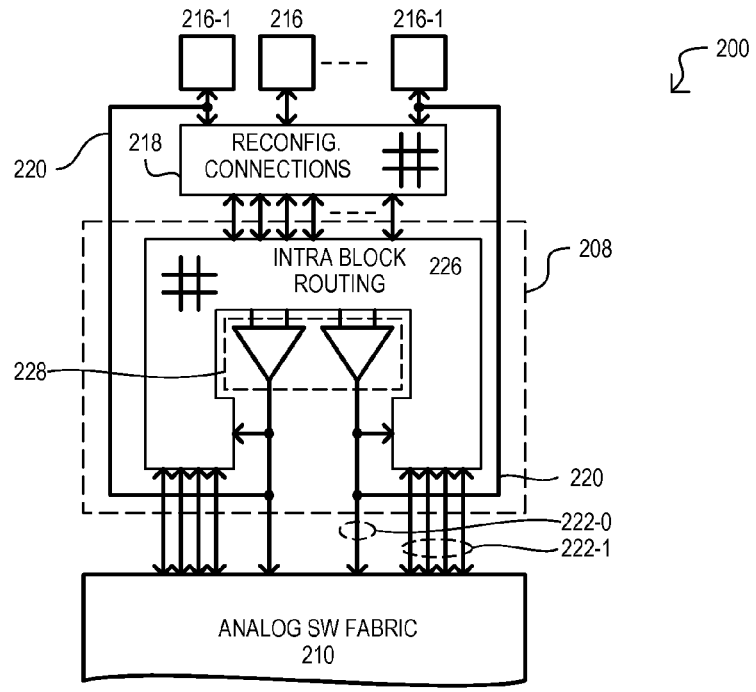
FIG. 2 is a block schematic diagram of an IC device according to an embodiment having a reconfigurable analog block with dedicated signal lines to an analog switch fabric and direct lines to input/output (I/O) connections.

FIG. 2 is a block schematic diagram of an IC device 200 according to another embodiment. IC device 200 can include a reconfigurable analog circuit section that provides a variety of different I/Os. An IC device 200 can include items like those of FIG. 1, and such like items are referred to by the same reference characters but with the first digit being a "2" instead of a "1".

FIG. 2 shows a reconfigurable analog circuit block 208 having analog circuits 228 and an intra-block routing fabric 226. Reconfigurable analog circuit block 208 can include dedicated signal lines 220-0/1 to analog switch fabric 210. Dedicated signal lines can include direct signal lines 222-1 and routed signal lines 222-0. Direct signal lines 222-1 can provide a direct signal path from an analog circuit 228 to analog switch fabric 210. Routed signal lines 222-0 can signal paths from intra-block routing fabric 226 to analog switch fabric 210.

FIG. 2 also shows direct I/O paths 220 from reconfigurable analog block 208 to direct I/Os 216-1. In the particular embodiment shown, direct I/O paths provide direct signal paths from analog circuits 228 to the direct I/Os 216-1.

Figure 3:
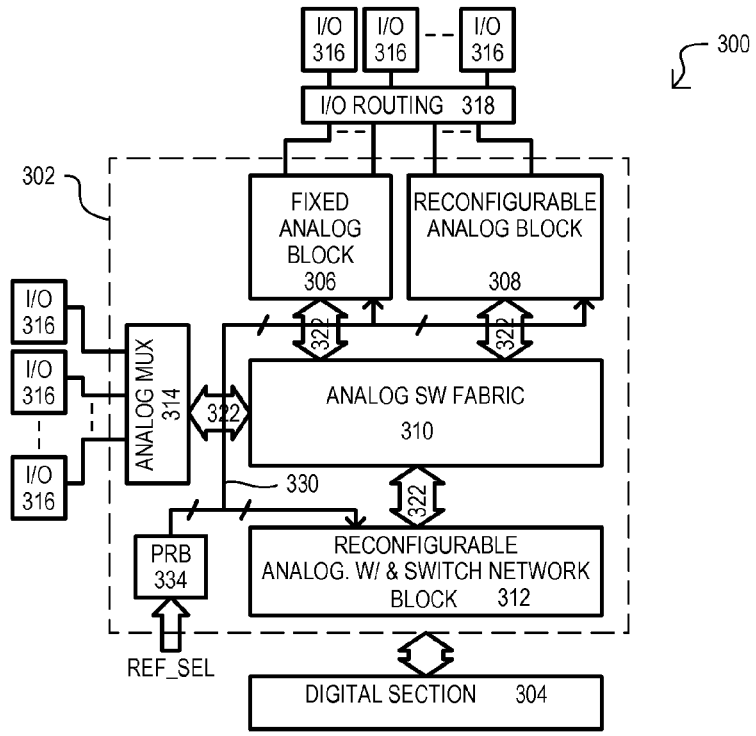
FIG. 3 is a block schematic diagram of an IC device according to an embodiment having reconfigurable analog blocks that receive programmable reference values from a programmable reference block (PRB).

FIG. 3 is a block schematic diagram of an IC device 300 according to another embodiment. IC device 300 can include a programmable reference block (PRB) that can generate multiple reference values for various analog blocks within an analog section 302. Such a reference supply can be a direct reference supply that does not have to pass though analog switching fabric. An IC device 300 can include items like those of FIG. 1, and such like items are referred to by the same reference characters but with the first digit being a "3" instead of a "1".

As shown in FIG. 3, an analog section 302 can include a PRB 334 that provides multiple programmable reference values 330 to each of analog blocks (306, 308, 312,).

Programmable reference values 330 are individually programmable by reference select values REF_SEL. Programmable reference values 330 can be voltages, currents, or combinations thereof.

In this way, an IC device can include a programmable reference bias circuit that provides reference values directly to multiple circuit blocks of a reconfigurable analog section.

Figure 4:
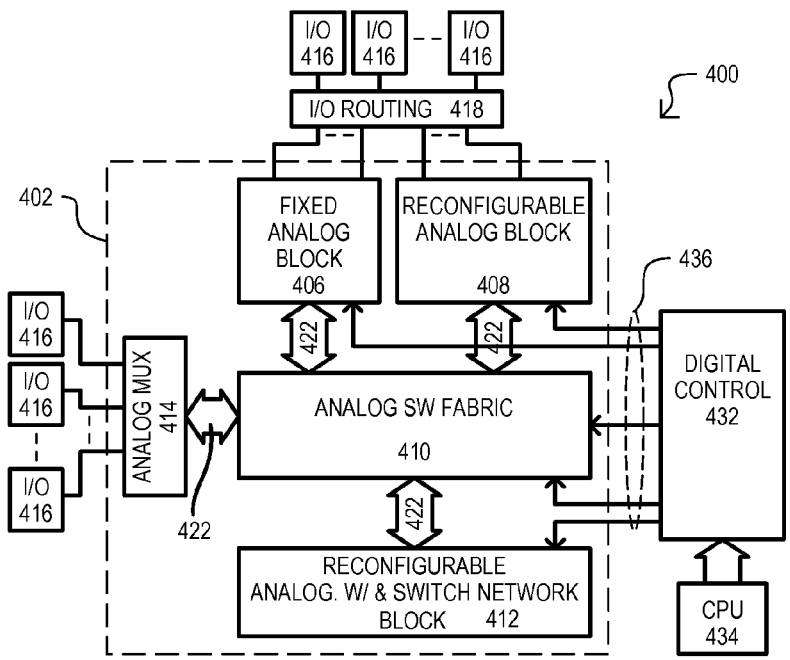
FIG. 4 is a block schematic diagram of an IC device according to an embodiment having reconfigurable analog blocks and a digital control section.

FIG. 4 is a block schematic diagram of an IC device 400 according to another embodiment. IC device 400 can include digital control of analog circuits within the various analog blocks. Such control can be via direct connections, and not via a switching fabric within the analog blocks. An IC device 300 can include items like those of FIG. 1, and such like items are referred to by the same reference characters but with the first digit being a "4" instead of a "1".

As shown in FIG. 4, IC device 400 can include a digital control section 432. Digital control section 432 can communicate with various analog blocks (406, 408, 410, 412) through digital connections 436. In some embodiments, digital control section 432 can include digital signal processing circuits. Digital connections 436 can provide any of the following: configuration values for analog blocks (406, 408, 410, 412), control signals for analog blocks (406, 408, 412), or data input and/or output paths for analog blocks (406, 408, 410, 412). Configuration signals can determine connections in switching fabrics within the analog blocks. Control signals can control the operation of analog circuits within the analog block. Configuration and control signals can be static and/or dynamic. Data input/output paths can allow data to be transferred between digital control section 432 and the analog blocks.

In the embodiment shown, digital control section 432 can operate in response to inputs from processor 434 residing on the same integrated circuit device 400. In some embodiments, a digital control section 432 can be formed with reconfigurable digital circuits.

In this way, the operation of various analog blocks (406, 408, 410, 412) can be controlled with digital signals. Further, digital signal processing can be incorporated into a processing path. That is, a same processing flow can incorporate continuous time signal processing (e.g., block 408) and/or discrete time processing (e.g., block 412) with digital signal processing provided by digital control section 432.

Figure 5:
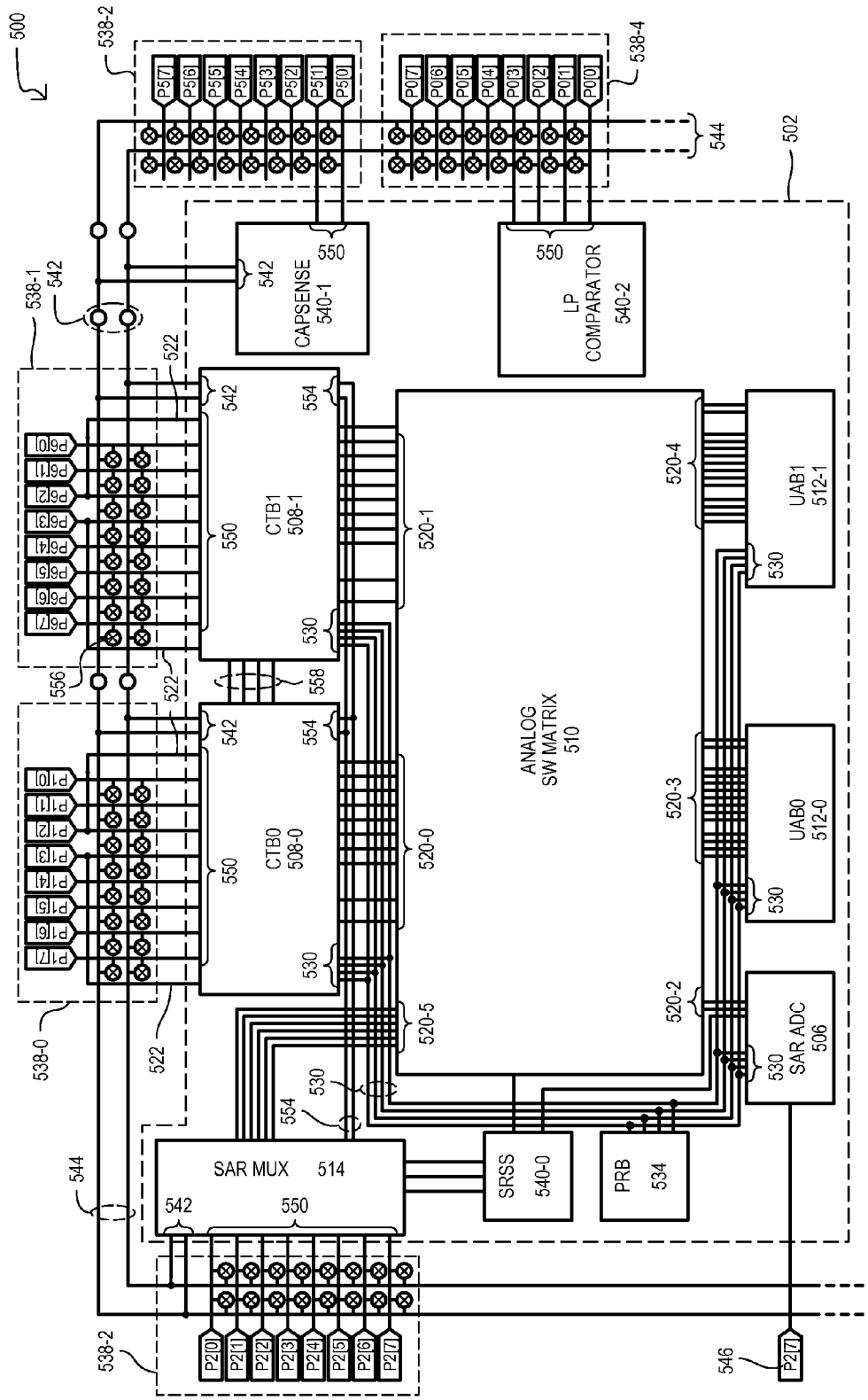
FIG. 5 is a block schematic diagram of an IC device according to another embodiment.

Referring now to FIG. 5, an IC device 500 according to another embodiment is shown in block schematic diagram. An IC device 500 can include an analog section 402 and an I/O subsystem (IOSS) 538-0 to -4. Circuits within analog section 402 can include fixed and reconfigurable analog circuits which can be configured and controlled as described herein, and equivalents.

Analog section 502 can include a SAR ADC circuit 506, continuous time (CT) blocks 508-0/1, analog switch fabric 510, universal analog blocks 512-0/1, a SAR MUX 514, a programmable reference bias circuit (PRB) 534, and other circuit blocks 540-0 to -2.

A SAR ADC 506 can receive input signals from analog switch fabric 510 via dedicated signal lines 520-2. In the embodiment shown, SAR ADC 506 can receive four reference values 530 from PRB 534, but in other embodiments the number of reference values can be greater or smaller. In one particular embodiment, programmable reference values are reference voltages. SAR ADC 506 can also receive a reference value from a reference I/O 546 (e.g., pad) of the IC device 500.

CT blocks 508-0/1 can include reconfigurable analog circuits for executing signal processing in a continuous time domain. In some embodiments, CT blocks 508-0/1 can include op amps reconfigurable into various analog circuits. CT blocks 508-0/1 can be connected to analog switching fabric via dedicated signal lines 520-0/1, respectively.

CT blocks 508-0/1 can also be connected to corresponding IOSS sections 538-0/1 through a number of signal lines, including indirect I/O lines 550, direct I/O lines 522, and analog bus lines 552. Indirect I/O lines 550 can be connected to various I/Os (P1[7:0], P6[7:0]) via I/O routing within the IOSS 538-0/1. Direct I/O lines 522 can have direct connections to particular I/Os (i.e., P1[2], P1[3], P6[2], P6[3]). Analog bus lines 552 can be connected to an analog bus 544. Each of CT blocks 508-0/1 can also receive the one or more reference values 530 from PRB 534. Signals can pass between CT blocks 508-0/1 via an intra block bus 558.

A SAR MUX 514 can be connected to analog switch fabric 510 by dedicated signal lines 520-5. Accordingly, signals from SAR MUX 514 can be routed to any of SAR ADC 506, CT blocks 508-0/1 or UABs 512-0/1. SAR MUX 514 can also be connected to corresponding IOSS section 538-2 via indirect I/O lines 550 and analog bus lines 552. Indirect I/O lines 550 can be connected to various I/Os (P2[7:0]) via I/O routing within the IOSS 538-2. Direct I/O lines 522 can have direct connections to particular I/Os (i.e., P1[2], P1[3], P6[2], P6[3]). Analog bus lines 552 can be connected to an analog bus 544. In the particular embodiment shown, SAR MUX 514 can have a direct connection to CT blocks 508-0/1 via a MUX bus 554.

UABs 512-0/1 can include additional reconfigurable analog circuits, including amplifiers and a switch network for implementing switched capacitor type circuits. Each of UABs 512-0/1 can be connected to analog switch fabric 510 by dedicated signal lines 520-3/4, respectively. Each UAB 512-0/1 can also receive the one or more reference values 530 from PRB 534.

A PRB 534 can provide reference values 530 to various blocks (506, 508-0/1, 512-0/1) as described. According to embodiments, reference values 530 are programmable through a wide variety of ranges, and can be based on a temperature stable reference value, such as a band-gap reference voltage, or other such references.

Other circuit blocks can include a test block 540-0, capacitance sense block 540-1, and low power comparator block 540-2. Test block 540-0 can provide test or other functions for the various other analog blocks. In the particular embodiment shown, test block 540-0 can be connected to SAR MUX 514, analog switch fabric 510, and SAR ADC 506. Capacitance sense block 540-1 can include circuits suitable for capacitance sensing operations, such as those performed on a touchscreen, as but one example. Capacitance sense block 540-1 can be connected to corresponding IOSS section 538-3 through indirect I/O lines 550 and to analog bus 544 via analog bus lines 552. Low power comparator block 540-2 can include a number of comparator circuits capable of operating in a low power mode. For example, low power comparator block 540-2 can include comparator circuits that are operational in a low power mode, while other blocks (e.g., UABs 512-0/1, SAR ADC 506) are not operational. Low power comparator block 540-2 can be connected to corresponding IOSS section 538-4 through direct I/O lines 550

Analog switch fabric 510 can provide reconfigurable analog signal routing between the various circuit blocks (506, 508-0/1, 512-0/1, and 514) by way of the dedicated signal lines (520-0 to -5). Such an arrangement can allow for an extremely large number of configurations, enabling signal processing to occur across multiple domains. Analog switch fabric 510 can include various signal lines and switches to interconnect such signal lines in numerous ways. The enabling/disabling of switches within the analog switch fabric 510 can be static, dynamic, or combinations thereof.

In some embodiments, the signal lines of the analog switch fabric 510 can be shielded. Such shielding can include conductive layers formed adjacent to the signal lines. In particular embodiments, signal lines of analog switch fabric 510 can be surrounded by shielding.

IOSS (538-0 to -4) can include various I/Os (P0[7:0], P1[7:0], P2[7:0], P5[7:0], P6[7:0]) along with an I/O routing formed with I/O switches (one shown 556). In the embodiment shown, I/O switches 556 can be dynamically switched. In one particular embodiment, I/O switches (e.g., 556) can be controlled by a processor of the IC device 500 (e.g., CPU direct memory access operation (DMA)) and/or sequencing logic from other digital circuits of the IC device 500. Analog bus 544 can run through IOSS sections (538-0 to -4), and can include analog bus switches (one set shown as 542). In the embodiment shown, analog bus switches (e.g., 542) can be static. In one particular embodiment, analog bus switches (e.g., 542) can be controlled by a processor (e.g., CPU DMA).

Figure 6:
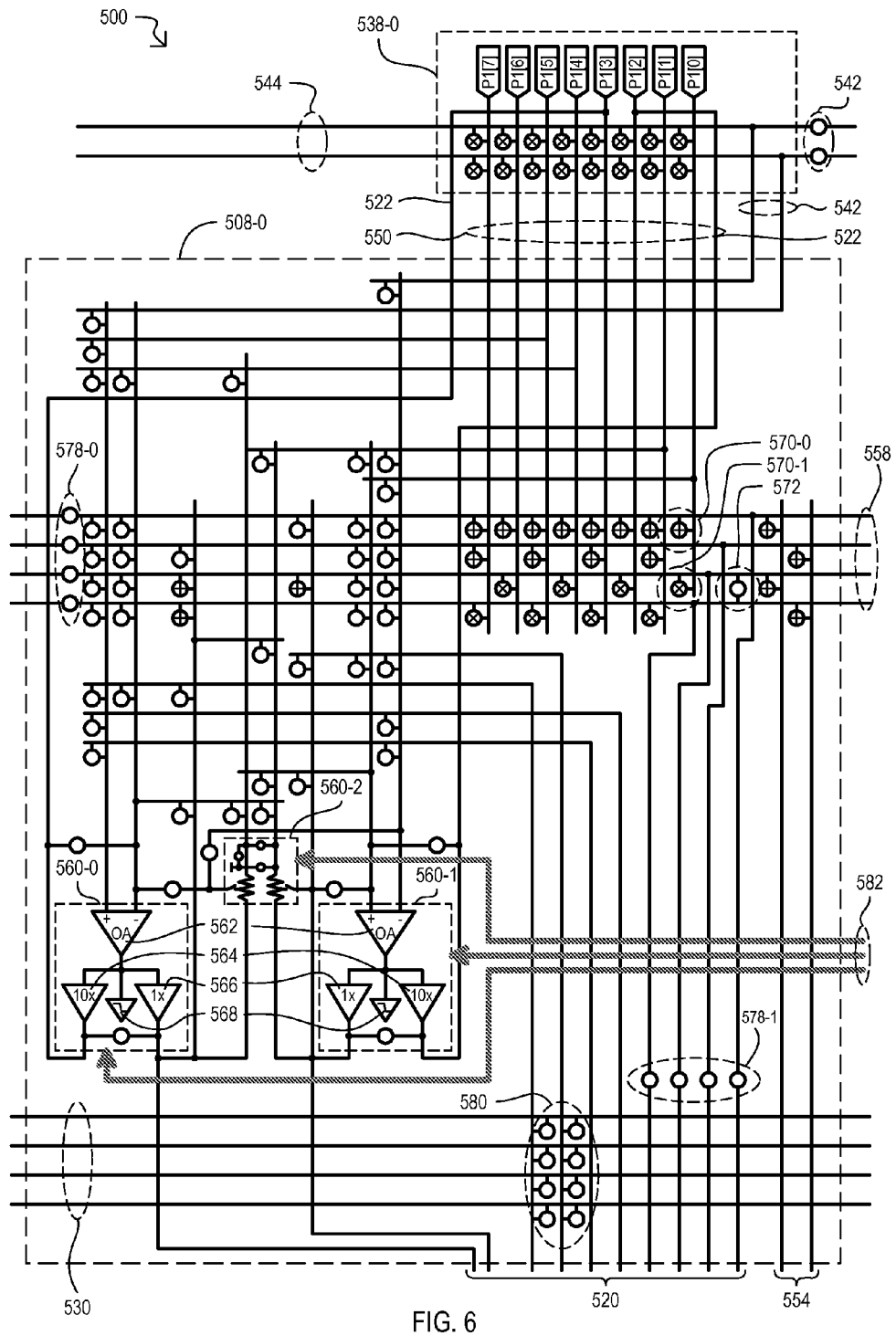
FIG. 6 is a detailed block schematic diagram showing analog circuit resources and a routing for a continuous time block that can be included in embodiments.

FIG. 6 is a block schematic diagram of an IOSS section 538-0 and corresponding CT block 508-0 according to an embodiment, such as those shown as 538-0/508-0 in FIG. 5. Like items are referred to by the same reference characters as FIG. 5.

IOSS section 538-0 can have a structure like that shown in FIG. 5, being connected to analog bus 544, which can include analog bus switches 542. IOSS section 538-0 includes I/Os (P1[7:0]) connected to CT block 508-0 by direct signal lines 522 and indirect I/O lines 550.

CT block 508-0 can include various circuit resources (560-0 to -2) for providing continuous time type signal processing. In the particular embodiment shown, circuit resources can include amplifier resources 560-0/1 and resistor resource 560-2. Amplifier resources 560-0/1 can each include an operational amplifier (op amp) 562, a 10× amplifier 564, a 1× amplifier 566 and a comparator 568. Resistor resource 560-2 can include resistors which can be switched into circuit configurations with the other circuit resources. For example, resistors can be configured as feedback resistances in op amp circuits.

As understood from FIG. 5, CT block 508-0 has various connections to other blocks of an IC device 500. As shown in FIG. 6, CT block 508-0 can be connected to another CT block via intra block bus 558, can receive reference values 530 (from a PRB, for example), can be connected to an analog switch fabric via dedicated signal lines 520, and can be connected to MUX bus 554.

Referring still to FIG. 6, circuit resources (560-0 to -2) can be interconnected with one another, and to various input/outputs of the CT block 508-0 through a network of conductive lines and switches. In the particular embodiment shown, switches can be operated in a dynamic or static fashion. Dynamically operated switches can be switched "on-the-fly" by the IC device 500 to switch between different configurations while the IC device 500 is in operation. Statically operated switches can be set in some initial operation, and then changed, if desired, by a reconfiguration process, which can require circuit operations to cease.

FIG. 6 shows three types of switches: first dynamic switches (one shown as 570-0), second dynamic switches (one shown as 570-1), and static switches (one shown as 572). In one particular embodiment, first dynamic switches (e.g., 570-0) can be controlled by an on-board processor of the IC device (e.g., CPU DMA), an analog section sequencing logic of the IC device (i.e., logic dedicated to controlling operations of analog circuits), or via a digital fabric that interconnects various other digital circuits of the IC device 500 (e.g., digital system interconnect (DSI)). Second dynamic switches (e.g., 570-1) can be controlled by an on-board processor (e.g., CPU DMA) or via a digital fabric (e.g., DSI). Controlling via a digital fabric (e.g., DSI) can enable dynamic switches (e.g., 570-0/1) to be controlled by various other digital circuits, including reconfigurable digital circuits. Static switches (e.g., 572) can be controlled by an on-board processor of the IC device (e.g., CPU DMA).

From FIG. 6 it is understood that various connections can be made, including connecting I/Os (e.g., P1[7:0] or any other I/Os via analog bus 544) to inputs or outputs of amplifiers, as well as place feedback resistors, enable connections between blocks, and the routing of block outputs to various locations. Isolation switch groups 578-0/1 can enable/disable connections between blocks. For example, isolation switch group 578-0 can enable/disable signal paths between the CT block 508-0 and another CT block, while isolation switch group 578-1 can enable/disable signal paths between CT block 508-0 and analog switch fabric 510. Reference switch group 580 can enable reference values 530 to be routed into other portions of the CT block 508-0.

Optionally, a CT block 508-0 can include digital control lines 582 that carry signals for controlling the various CT block resources 560-0 to -2.

While the switching arrangement shown in FIG. 6 provides advantageous flexibility in realizing numerous circuit configurations, alternate embodiments can include different types of switch arrangements.

Figure 7:
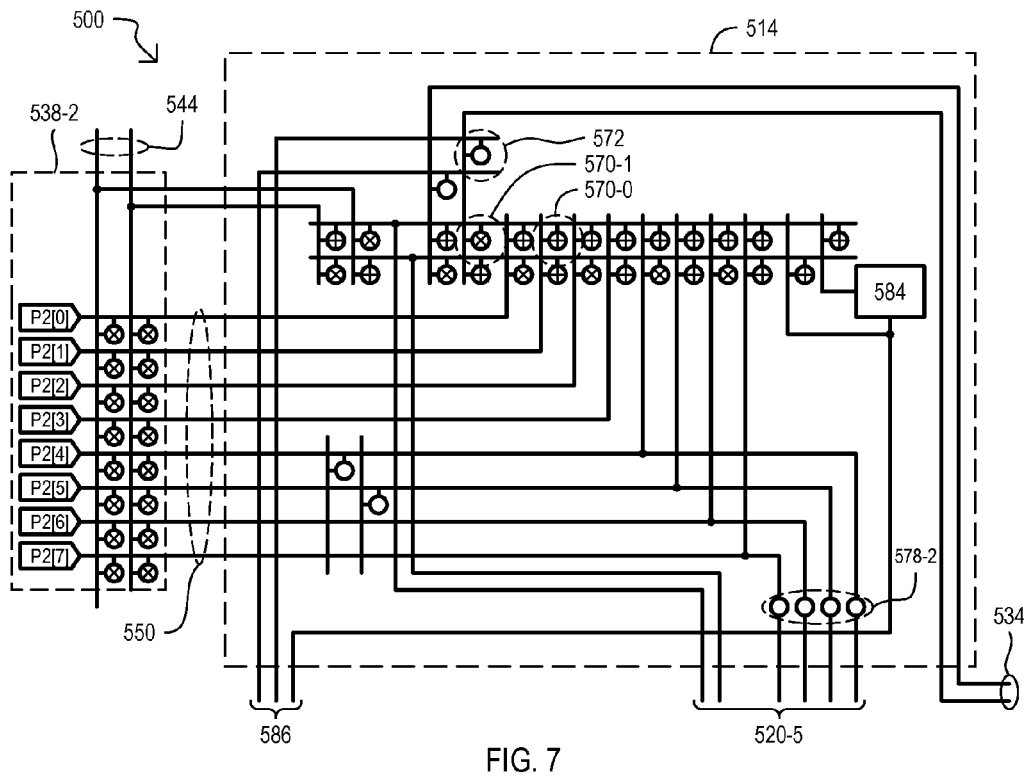
FIG. 7 is a detailed block schematic diagram showing routing for an analog multiplexer that can be included in embodiments.

FIG. 7 is a block schematic diagram of an IOSS section 538 and corresponding SAR MUX 514 according to an embodiment, such as those shown as 538-2/514 in FIG. 5. Like items are referred to by the same reference characters as FIG. 5.

IOSS section 538-2 can have a structure like that shown in FIG. 5, being connected to analog bus 544 and including I/Os (P2[7:0]) connected to SAR MUX 514 by indirect I/O lines 550.

SAR MUX 514 can have various connections to other blocks of an IC device 500. As shown in FIG. 7, SAR MUX 514 can be connected to an analog switch fabric via dedicated signal lines 520-5 and to a MUX bus 554. In addition, SAR MUX 514 can be connected to a test circuit via test connections 586. SAR MUX 514 can provide various reconfigurable interconnection paths by way of a network of conductive lines and switches. Switches can vary as in the case of FIG. 6 (i.e., dynamic or static) and are identified in the same manner as FIG. 6, showing first dynamic switches (one shown as 570-0), second dynamic switches (one shown as 570-1), and static switches (one shown as 572). The particular embodiment of FIG. 7 also shows a bus isolation switch group 578-2 which can isolate some connections to analog switch fabric, and temperature sensor 584.

A temperature sensor 584 can sense a temperature of the IC device 500. Such a feature can enable various operations of the IC device 500 to be adjusted based on a sensed temperature. As but one example, the temperature can be used to establish programming parameters for storage circuits (e.g., flash memory) of the IC device 500. In a particular embodiment, a temperature sensor 584 can measure temperature based a forward biased transistor of the IC device 500. Further, in some embodiments, a temperature sensor 584 can include its own ADC to provide a measured temperature as a digital value. In one embodiment, a temperature sensor 584 can have an effective temperature sensing range of about −40° C. to about +85° C., +/−5° C.

While the switching arrangement shown in FIG. 7 provides advantageous flexibility in realizing numerous circuit configurations, alternate embodiments can include different types of switch arrangements.

Figure 8:
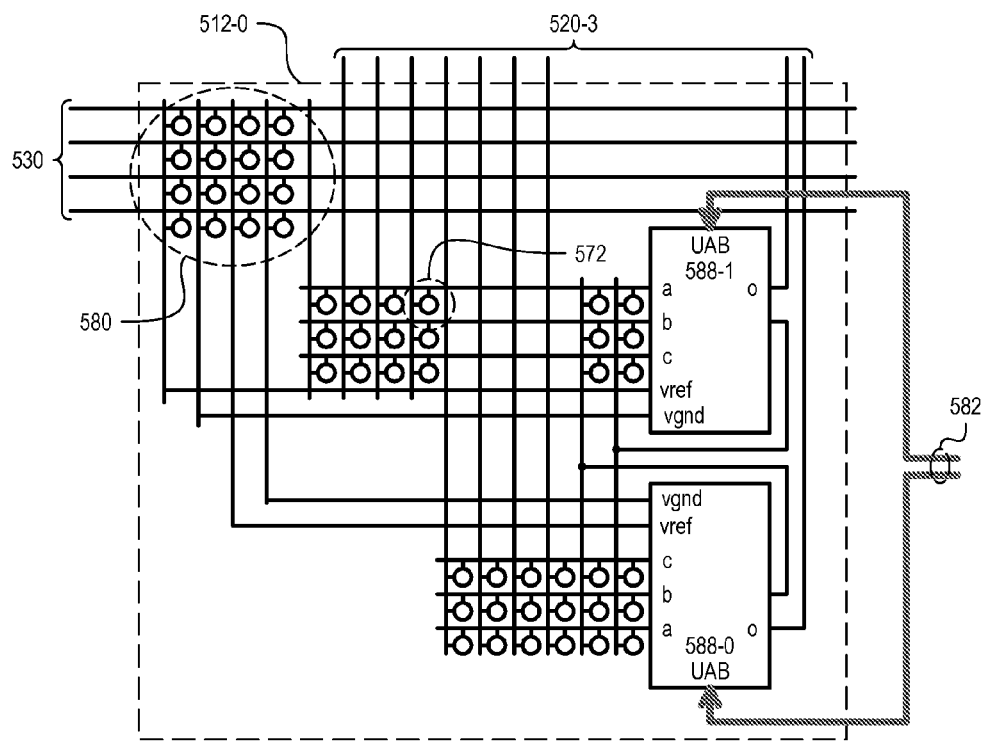
FIG. 8 is a detailed block schematic diagram showing analog circuit resources and a routing for a universal analog block that can be included in embodiments.

FIG. 8 is a block schematic diagram of a UAB 512-0 according to an embodiment, like that shown as 512-0 in FIG. 5. Like items are referred to by the same reference characters as FIG. 5.

UAB 512-0 can include various analog circuit resources. In some embodiments, such resources can include analog circuit components, such as op amps in combination with a switch network. Such an arrangement can provide for discrete time type signal processing. In the particular embodiment shown, UAB 512-0 includes two matching circuit resources 588-0/1.

As understood from FIG. 5, UAB 512-0 has various connections to other blocks of an IC device 500. Dedicated signal lines 520-3 can provide connections to an analog switch fabric. UAB 512-0 can also receive reference values 530 from a PRB. As shown in FIG. 8, UAB 512-0 can enable various configurations between resources and I/Os through a network of conductive lines and switches. Switches are shown as in the case of FIGS. 6 and 7. In the particular embodiment shown, switches of UAB 512-0 can be static switches (one shown as 572). Reference switch group 580 can enable reference values 530 to be routed to various portions of the UAB 512-0.

Optionally, a UAB 512-0 can include digital control lines 582 that carry signals for controlling the various UAB resources 588-0/1.

While the switching arrangement shown in FIG. 8 provides advantageous flexibility in realizing numerous circuit configurations, alternate embodiments can include different types of switch arrangements.

Figure 9:
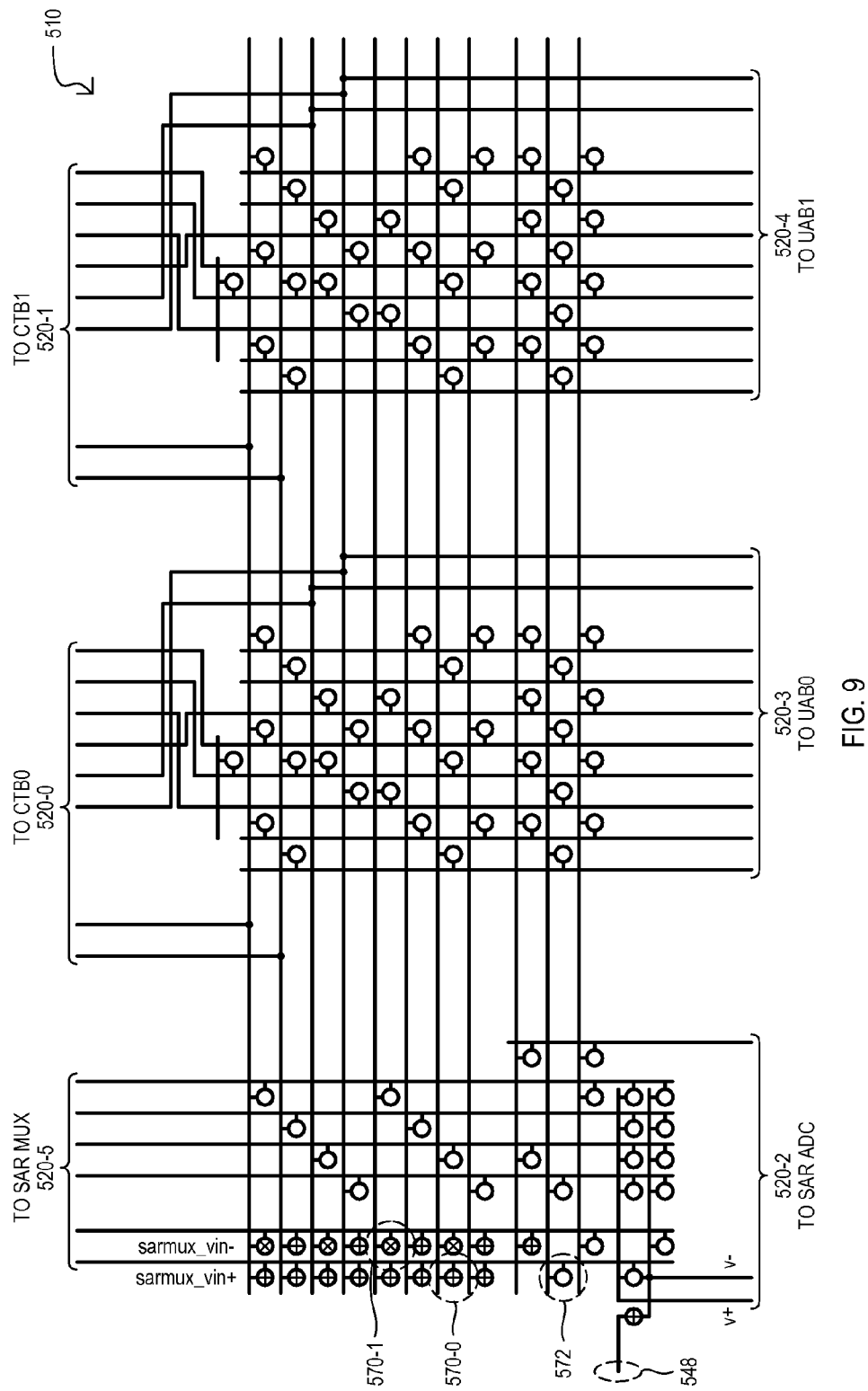
FIG. 9 is a detailed block schematic diagram showing an analog switch fabric that can be included in embodiments.

FIG. 9 is a schematic diagram of an analog switch fabric 510, and can be one particular implementation of that shown in FIG. 5. Analog switch fabric 510 can receive dedicated signal lines 520-0 to -5 from two CT blocks (CTB0/1), a SAR ADC, two UABs (UAB0/1), and a SAR MUX, respectively. As shown, analog switch fabric 510 can provide a switch matrix for connecting such dedicated signal lines (520-0 to -5) to one another. Switches within analog switch fabric 510 can vary as in the case of FIG. 6 (i.e., dynamic or static) and are identified in the same manner as FIG. 6, including first dynamic switches (one shown as 570-0), second dynamic switches (one shown as 570-1), and static switches (one shown as 572).

The switching arrangement shown in FIG. 9 is but one implementation, and alternate embodiments can include different types of switch arrangements.

Figure 10:
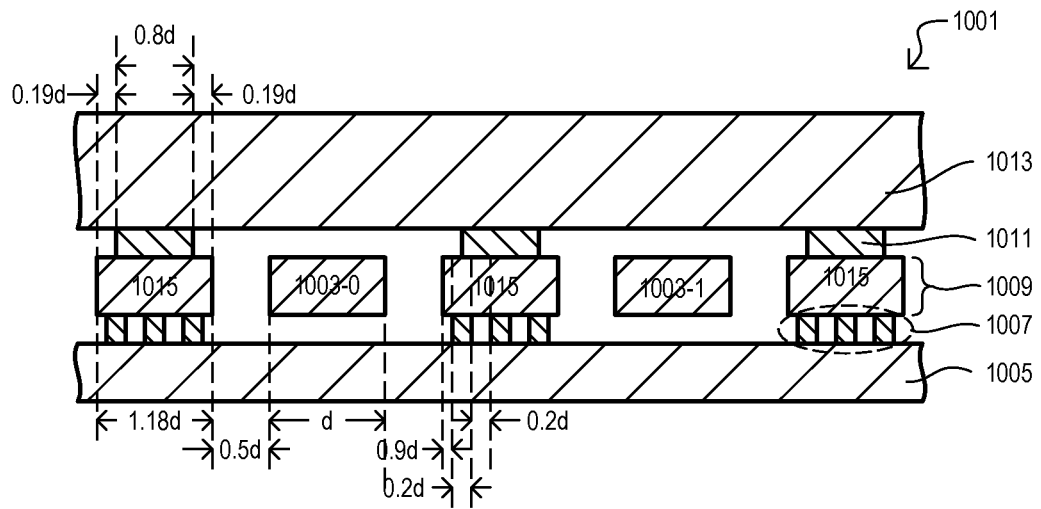
FIG. 10 is a side cross sectional view of signal shielding that can be included in embodiments.

As noted above, signal paths of IC devices as described herein can be shielded. FIG. 10 shows a type of shielding 1001 that can be included in the embodiments. Shielding 1001 can be used to shield any of the lines described herein, but can particularly be included in analog switch matrices and intra-block routings as described herein.

A shielding 1001 can be formed with three conductive layers 1005, 1009 and 1013, which can be different metallization layers in some embodiments. In a particular embodiment, layer 1005 can be a third metallization layer (M3), layer 1009 can be a fourth metallization layer (M4), and layer 1013 can be a fifth metallization layer (M5).

Layer 1009 can be patterned into signal lines 1003-0/1 (for carrying signals) and shielding lines 1015. In one embodiment, each signal line 1003-0/1 can have shielding lines 1015 adjacent to it on both sides. In the embodiment shown, shielding lines 1015 can be conductively connected with the lower layer 1005 by first vertical interconnects 1007, and conductively connected with the higher layer 1013 by second vertical interconnects 1011.

FIG. 10 includes relative spacing with respect to a width of a signal line 1003-0/1, shown as d.

While FIG. 10 shows a shielding which completely surrounds each signal line 1003-0/1, alternate embodiments can include shielding that does not completely surround each signal line.

Figure 11:
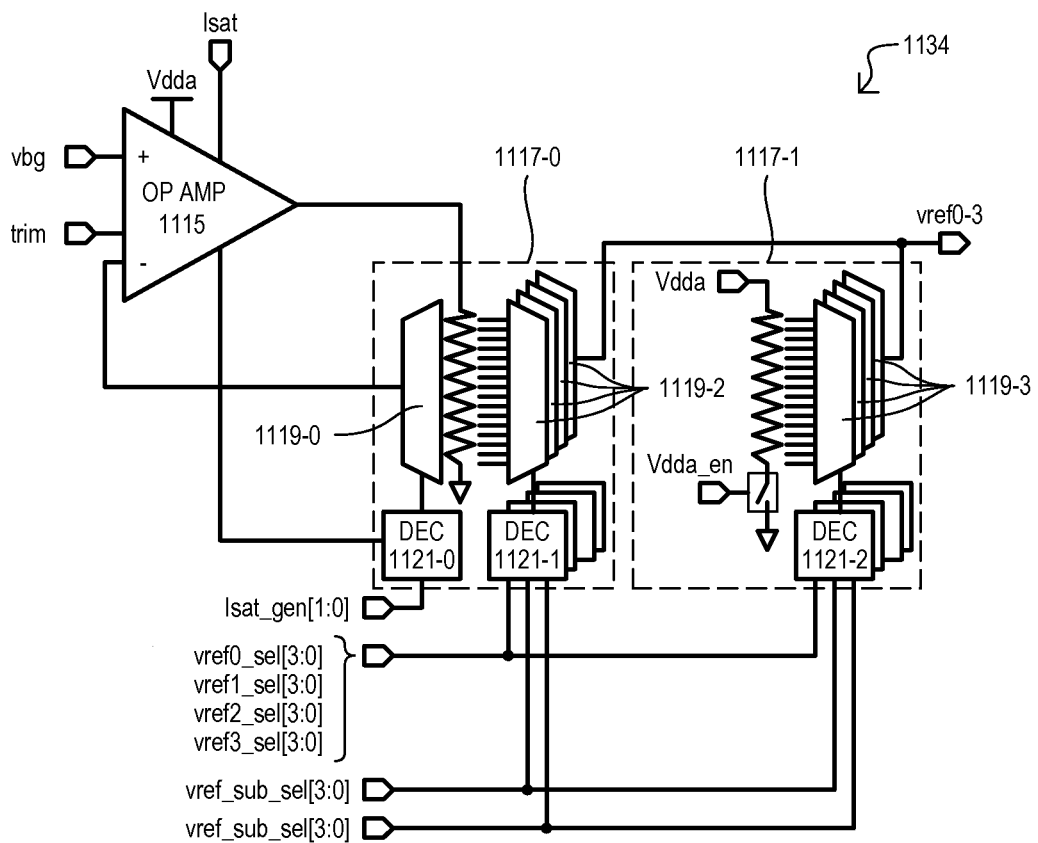
FIG. 11 is block schematic diagram of a PRB that can be included in embodiments.

FIG. 11 is a block schematic diagram of a PRB 1134 according to an embodiment. The particular PRB 1134 shown generates four reference voltages, but alternate embodiments can provide a greater or lesser number of reference voltages and/or can provide reference currents. A PRB 1134 has a multi-ground, multi reference level capability. As shown in embodiments herein, a PRB 1134 can provide reference values to various or all blocks of an IC device.

A PRB 1134 can include an op amp 1115 and two programming blocks 1117-0/1. Programmable block 1117-0 can include a first MUX 1119-0 and a set of four output MUXs 1119-2. In response to signals from decoder 1121-0, first MUX 1119-0 can enable a particular feedback resistance path to op amp 1115. In a similar fashion, in response to a corresponding decoder 1121-1, each of output MUXs 1119-2 can provide a particular output resistance. Programmable block 1117-1 can include a set of four output MUXs 1119-3. In response to a corresponding decoder 1121-2, each of output MUXs 1119-3 can provide a particular output resistance.

Figure 12:
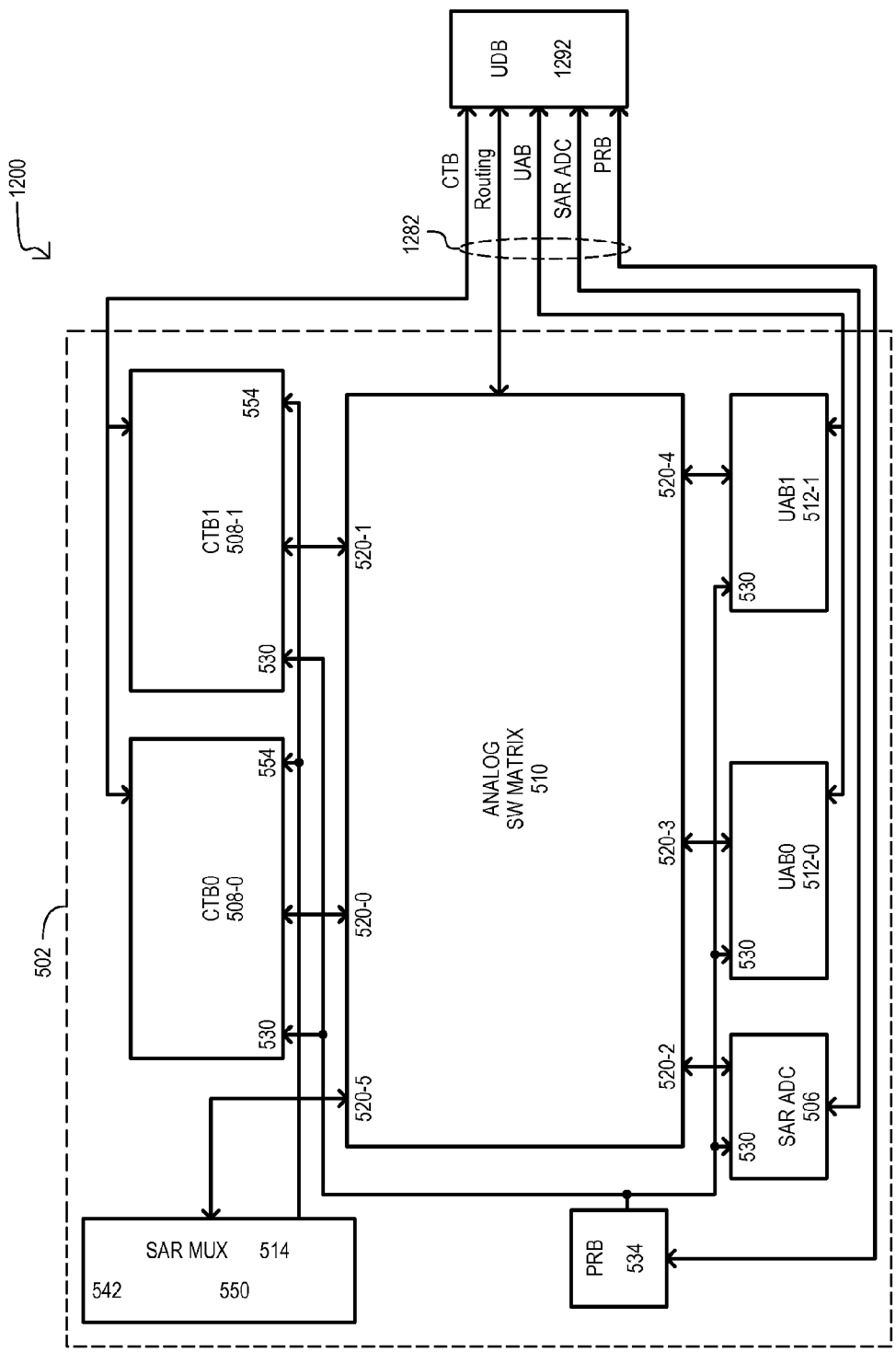
FIG. 12 is a block schematic diagram of an IC device according to another embodiment.

FIG. 12 is a block diagram of an IC device 1200 according to another embodiment. IC device 1200 can include items like those of FIG. 5, and like items are referred to the same reference characters.

In FIG. 12, IC device 1200 can include digital connections to various analog blocks of analog section 502. In particular, there can be digital control lines 1282 to CT blocks 508-0/1, analog switch fabric 510, PRB 534, SAR ADC 506, and UABs 512-0/1. It is understood that digital control lines 1282 can carry both controls signals and data. With this set of connections, configurations of such analog blocks (508-0/1, 510, 534, 506, 512-0/1) can be arbitrarily adjusted and output states from such analog blocks can be read out into a digital control circuit 1292. This can also enable generalized control loop formation with digital logic in the loop or any number of arbitrary mixed analog/digital transfer functions.

In the particular embodiment shown, digit control lines 1282 can be connected to digital control circuit 1292, which can be a universal digital block (UDB) in a particular embodiment. A UDB 1292 can include digital circuits, and in particular embodiments, reconfigurable digital circuits. However, alternate embodiments can include any other suitable digital circuits. Monitor and control based on digital states could also be done by a local controller or by logic intelligence within each analog block (508-0/1, 510, 534, 506, 512-0/1) itself.

Figure 13:
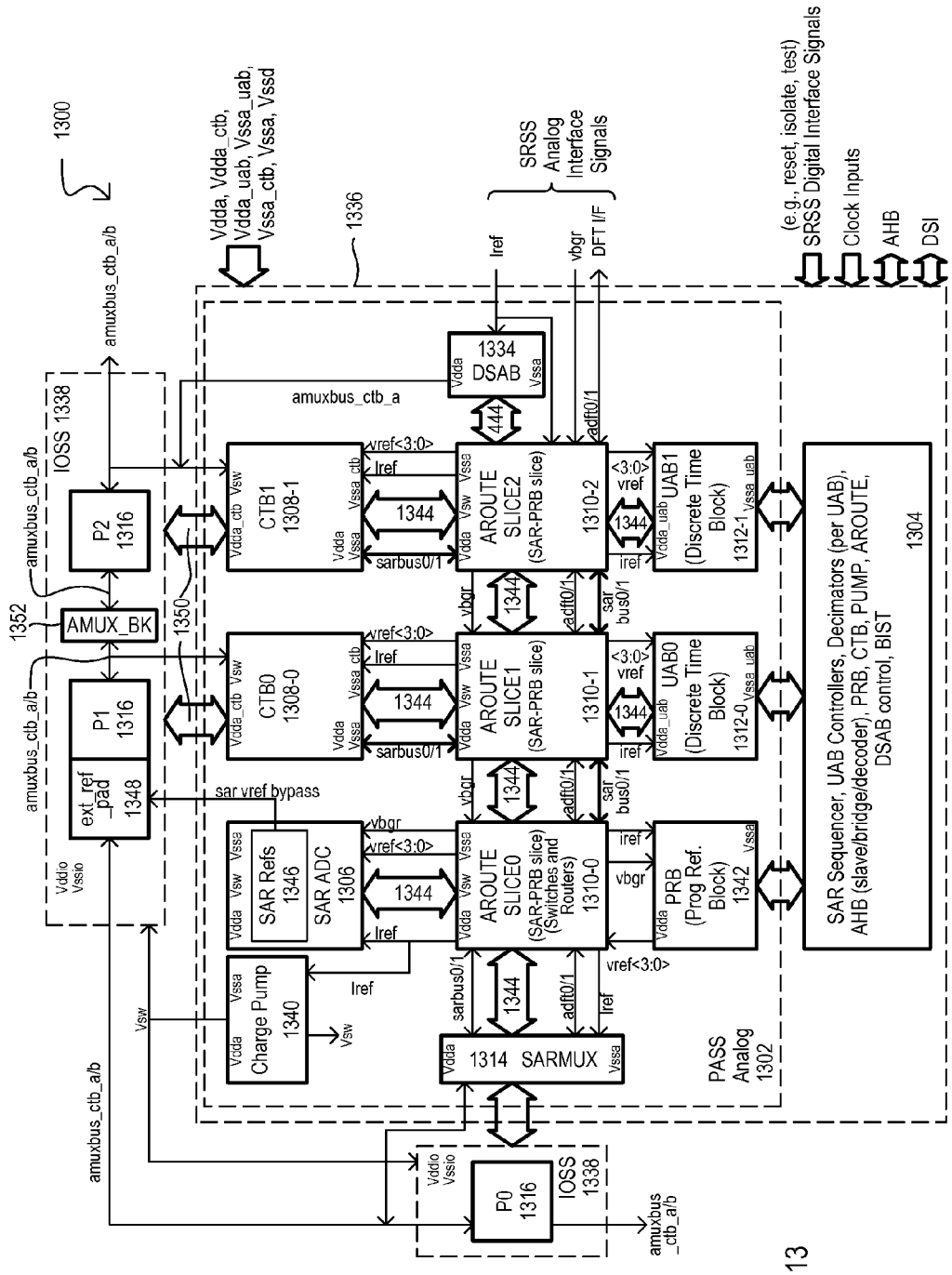
FIG. 13 is a detailed block schematic diagram of an IC device according to another embodiment.

Referring now to FIG. 13, an IC device 1300 according to one detailed embodiment is shown in block schematic diagram. An IC device 1300 can include a programmable analog subsystem PASS 1336 and an I/O subsystem (IOSS) 1338. PASS 1336 can include an analog section 1302 and a digital section 1304. Circuits within analog section 1302 can include fixed and reconfigurable analog circuits which can be configured and controlled by circuits within digital section 1304. In particular embodiments, IC device 1300 can be one implementation of that shown in any of FIGS. 1, 3, 4, 5 and 16.

Analog section 1302 can include a SAR ADC circuit 1306, continuous time (CT) blocks 1308-0/1, analog routing blocks 1310-0 to -2 (which can from an analog switch fabric), universal analog blocks 1312-0/1, a SAR MUX 1314, an amplifier bias circuit 1334, a charge pump 1340, a programmable reference block (PRB) 1342, and an amplifier bias circuit 1334.

A SAR ADC 1306 can receive input signals from and provide output signals to analog routing 1344, which can include dedicated signal lines for the SAR ADC 1306. In some embodiments, SAR ADC 1306 can also provide digital output values (e.g., conversion values) to digital section 1304. A SAR ADC 1306 can be a high resolution circuit providing output values of 12-bits or greater. In the embodiment shown, SAR ADC 1306 can receive a reference current Iref, up to four reference voltages (vref<3:0>), and a bandgap reference voltage (vbgr) for use in conversion operations. SAR ADC 1306 can include a reference section 1346 which can receive a reference value from a reference I/O 1348 (e.g., pad) of the IC device 1300. SAR ADC 1306 can receive high and low analog power supplies (Vdda, Vssa) as well as a switch power supply Vsw.

CT blocks 1308-0/1 can include reconfigurable analog circuits for executing signal processing in a continuous time domain. In some embodiments, CT blocks 1308-0/1 can include op amps reconfigurable into various analog circuits as well as other circuit elements, such as resistors. Each of CT blocks 1308-0/1 can receive input signals from and/or provide output signals to IOSS 1338 via corresponding I/O connections 1350. In addition, each of CT blocks 1308-0/1 can receive input signals from and/or provide output signals to analog routing 1344, which can include dedicated signal lines for each CT block 1308-0/1. Still further, each CT block 1308-0/1 can be connected to a low resistance and/or low noise routing (sarbus0/1). In the embodiment shown, CT blocks 1308-0/1 can receive high and low analog power supplies (Vdda, Vssa), a switch power supply (Vsw), as well as a block power supplies (Vdda_ctb, Vssa_ctb). Further, CT blocks 1308-0/1 can receive a reference current Iref and up to four reference voltages (vref<3:0>) via analog routing blocks 1310-0 to -2.

CT blocks 1308-0/1 can include op amps reconfigurable into various "front-end" functions of an analog system. As but two examples, op amps within CT blocks 1308-0/1 can be configured into a class-A mode to amplify analog input signals; or the same op amps can be configured into a class-AB mode to drive output analog signals (on an I/O 1316, for example).

Analog routing blocks 1310-0 to -2 can provide reconfigurable analog routing (an analog switch fabric) between SAR ADC 1306, CT blocks 1308-0/1, UABs 1312-0/1, SAR MUX 1314 and amplifier bias circuit 1334, via analog routing 1344. Analog routing blocks 1310-0 to -2 can also provide reconfigurable low resistance/noise routing (via sarbus0/1) between SAR MUX 1314 and CT blocks 1308-0/1. Analog routing blocks 1310-0 to -2 can also route reference voltages to the various blocks, including: the four reference voltages (vref<3:0>) from PRB 1342 to any of SAR ADC 1306, CT blocks 1308-0/1 or UABs 1312-0/1; the bandgap voltage (vbgr) to SAR ADC 1306 and/or PRB 1342; and a reference current (Iref) to any of charge pump 1340, SAR ADC 1306, CT blocks 1308-0/1, SAR MUX 1314, PRB 1342, or UABs 1312-0/1. In the embodiment shown, analog routing blocks 1310-0 to -2 can also route signal paths (adft0/1) for a design-for-test I/F (not shown).

UABs 1312-0/1 can include additional reconfigurable analog circuits, including amplifiers and a switch network for implementing switched capacitor type circuits. Each of UABs 1312-0/1 can receive input signals from and/or provide output signals to analog routing 1344, which can include dedicated signal lines for each UAB 1312-0/1. In some embodiments, UABs 1312-0/1 can be configured to provide ADC functions, such as sigma-delta ADC conversion, for example. However, in other embodiments, UABs 1312-0/1 can be configured into digital-to-analog converters (DACs). In the embodiment shown, UABs 1312-0/1 can receive block power supplies (Vdda_uab, Vssa_uab). Further, CT blocks 1308-0/1 can receive a reference current Iref and up to four reference voltages (vref<3:0>) via analog routing blocks 1310-0 to -2.

A SAR MUX 1314 can connect a set of I/Os 1316 to analog routing blocks 1310-0 to -2, and hence to any of SAR ADC 1306, CT blocks 1308-0/1 or UABs 1312-0/1. Further, in the embodiment shown, SAR MUX 1314 can provide a direct connection between I/Os 1316 and a low resistance/ noise bus (sarbus0/1). SAR MUX 1314 can also receive a reference current Iref and analog power supplies (Vdda, Vssa). In a particular embodiment, a SAR MUX 1306 can provide no less than 8:1 multiplexing.

Amplifier bias circuit 1334 can generate bias currents for analog circuits within the analog section 1302, such as amplifier circuits, as but one example. These bias currents can enable analog circuits to remain operational in low power modes of operation. In addition, these bias currents are programmable to provide a wide range of values. In the embodiment shown, such bias currents can be provided by way of analog routing 1344. In addition, bias current can provided via an analog MUX bus (amuxbus_ctb_a/b). In very particular embodiments, bias currents can be routed to amplifiers within CT blocks 1308-0/1 and/or UABs 1312-0/1 in a lower power mode.

A charge pump 1340 can generate pump voltages from analog power supply (Vdda, Vssa). In some embodiments, pump voltages can be outside of the provided power supply range (i.e., greater than Vdda or less than Vssa). In the particular embodiment shown, charge pump 1340 can generate a switch voltage Vsw. A switch voltage Vsw can be used to lower a resistance of switches within routing networks.

A PRB 1342 can provide programmable reference values for use by some or all analog blocks (1306, 1308-0/1, 1312-0/1, 1306, 1340). Reference values can be voltages or currents. In the particular embodiment shown, PRB 1342 can provide four reference voltage vref<3:0>, each of which is a programmable value. A bandgap reference voltage (vbgr) can be used to ensure reference voltages vref<3:0> are stable over a range of temperatures. In some embodiments, reference values can be connected to other analog blocks via analog routing blocks 1310-0 to -2. In addition or alternatively, an IC device 1300 can include a reference value routing network that provides reference values to an analog block independent of analog routing blocks 1310-0 to -2.

IOSS 1338 can include various I/Os 1316 of the IC device 1300. An IOSS 1338 can also include an analog MUX 1352, which can selectively connect any of I/Os 1316 to analog MUX bus (amuxbus_ctb_a/b). IOSS 1338 can receive an I/O power supply (Vddio, Vssio). It is understood that in FIG. 4, each of I/Os 1316 can represent multiple physical I/Os to IC device 1300.

A digital section 1304 can provide control and sequencing signals for various portions of the analog section 1302. Digital section 1304 can include various circuits for controlling analog circuit operations. In the particular embodiment shown, digital section 1304 can include: a SAR Sequencer for controlling conversion operations of SAR ADC 1306; UAB Controllers for controlling operations within UABs 1312-0/1, such as switch capacitor network controls; decimator controls such as those used in sigma-delta ADC operations; as well as control/configuration signals for PRB 1342, CT blocks 1308-0/1, charge pump 1340, analog routing blocks 1310-0 to -2, and amplifier bias circuit 1334. Digital section 1304 can further include a processor interface, which in this embodiment is an AHB compatible interface, as well as built-in self-test (BIST) controls.

In some embodiments, digital section 1304 can include logic circuits that can provide digital processing of analog signals originating in analog section 1302 (or from a source external to PASS 1336.

According to embodiments, digital section 1304 can integrate the various functions having different control paradigms (e.g., static, dynamic, state machine control, or event driven) into one or more signals paths within the PASS 1336. According to embodiments, digital control of analog circuits within analog section 1302 can be according to registers (firmware), finite state machine and also event driven control capability included within, or derived from, circuits within digital section 1304.

As shown in FIG. 13, PASS 1336 can receive various power supply voltages (Vdda, Vdda_ctb, Vdda_uab, Vssa_uab, Vssa_ctb, Vssa, and Vssd). In addition, PASS 1336 can have various digital signal connections, including interface signals (e.g., reset, isolate, test), clock inputs, an AHB compatible bus, and a digital bus which can be connected to other digital circuits of the IC device (not shown), such as reconfigurable digital blocks.

Having described various structures included within IC device 1300, particular configurations/operations of the IC device will now be described.

According to some embodiments, analog blocks within analog section 1302 can be configured into any of: low offset-noise front ends (by utilizing low resistance/noise bus sarbus0/1), ADCs, digital-to-analog converter (DACs), programmable gain amplifiers (PGAs), filters (both analog and digital), programmable amplifiers, mixers, modulators, integrators, summers, programmable references and a very large number of switched capacitor functions. Such functions can be controlled across various signal paths, along with the routing of corresponding signals. Such control can be static or dynamic. Multiple analog blocks can be chained together to create higher order transfer functions in not only a single-ended fashion, but also a differential-like fashion.

The reconfigurability provided by PASS 1336 can be conceptualized being (a) topological, (b) functional and (c) parametric. Topological configurability can be the ability to make different topological choices for a given function. For example, two UABs 1312-0/1 can be configured as switched capacitor biquad filters. The flexibility in configuration provided by PASS 1336 can enable the filter to be configured as a Gregorian-Temes type biquad filter or a Tow-Thomas type biquad filter. Similarly, a UAB 1312-0/1 can be configured into a signal-delta modulator with a traditional feedback topology, or one with an optional feedforward path. Functional configurability can be the ability of one block to be configured into various different functions. For example, a CT block 1308-0/1 can be configured into various functional modes, including but not limited to a buffer, an inverting amplifier, a non-inverting amplifier, a differential programmable gain amplifier, a comparator with hysteresis, or a window comparator. Such variations can also be provided by a UAB 1312-0/1. Parametric configurability can be the ability to control the parameters of the operation. Examples can include changes in gain, SNR, data rate, or the ability to operate in a continuous time or discrete time fashion. Other examples can include operating in a voltage mode or current mode.

The high degree of configurability provided by a PASS 1336 or equivalent arrangement, can enable optimization of analog functions, as tradeoffs can be made amongst performance parameters (e.g., signal-to-noise ratio (SNR), speed, and power).

Possible configurations of an IC device 1300 include, but by no means are limited to: a 12-bit, SAR ADC operating at 1 Msps; a 14-bit incremental ADC operating at 100 sps; a 12-bit multiplying DAC operating at 500 ksps; rail-to-rail amplifiers with a high drive capability (up to 10 mA); reconfigurable switched capacitor filters; and a wide variety of amplifier, mixer, filter and comparators configurations. Such configurations are possible my chaining several blocks of an analog section 1302. For example, UAB blocks can be chained to create higher order filters and sigma-delta modulators.

In one very particular embodiment, an IC device 1300 can be configured to provide a 70 dB SNR channel using a 10 kHz 128 mV amplitude input signal. Input signals can be provided via a pair of I/Os 1316, and amplified by a differential amplifier configured within a CT block (1308-0/1) to have a gain of 8 and in a low-pass configuration with a cut-off frequency of 100 kHz. Signals can be further amplified differentially by amplifiers within a UAB (1312-0/2) with a gain of 2. A resulting amplified signal can then be provided to SAR ADC, which can be a 12-bit ADC sampling differentially at 600 ksps using a properly bypassed 2.048V reference (from PRB). Supply conditions can include Vdda=2.7 V.

Particular examples of configurations for an IC device 1300 will now be described. It is understood that these configurations are provided by way of example only, the PASS 1336 being reconfigurable into vast assortment of different circuit implementations.

Figure 14:
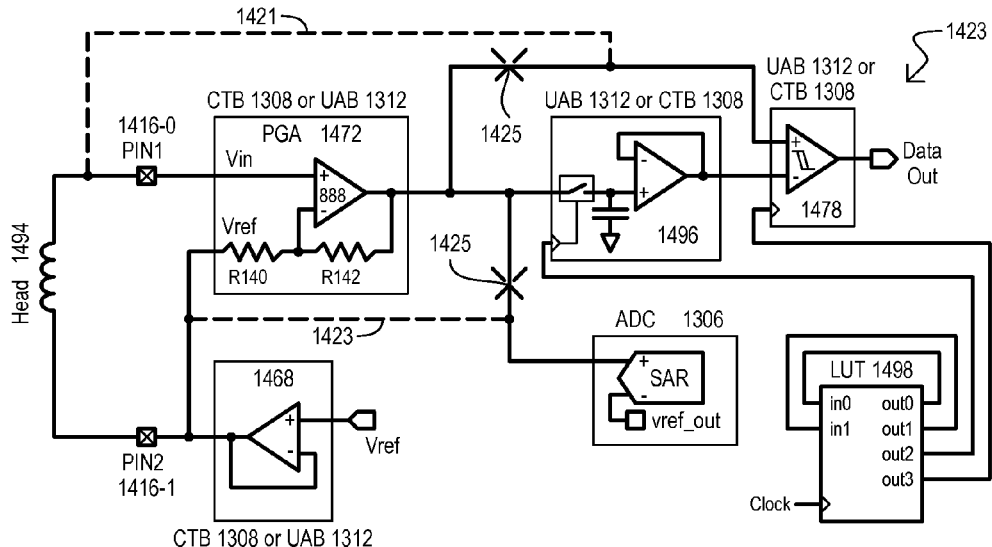
FIG. 14 is a schematic diagram of a variations on a magnetic card reader path that can be implemented in an IC device like that of FIG. 13.

FIG. 14 shows a signal path 1423 that can be implemented in an IC device 1300 like that of FIG. 13, and that can be reconfigured by altering signal routing. Signal path 1423 can be a magnetic card reader which can read a value encoded into a magnetic strip. In the embodiment shown, signal path 1423 can be produced by configuring one or more CT Blocks or UABs as well as various paths through analog switching fabric 410.

One or more CT blocks 1308 can be configured into a programmable gain amplifier (PGA) 1472 and buffer 1468. Alternatively, PGA 1472 and/or buffer 1468 could be realized in a UAB 1312. One or more UABs 1312 can be configured into a track and hold (track/hold) circuit 1496 and a comparator 1478. Alternatively, track/hold circuit 1486 and/or comparator 1478 could be realized in a CT block 1308.

A signal path 1423 can further include a state machine (look up table (LUT)) 1498. In some embodiments a LUT 1498 can reside in a digital section (e.g., 1304) of PASS 1336. However, in other embodiments, a LUT 1498 could be present in a UAB 1312 and/or CT Block 1310.

In operation, a magnetic strip can be swiped across magnetic head 1494. Magnetic head 1494 can be connected between I/Os 1416-0 (PIN1) and 1416-1 (PIN2). PIN1 can be an input voltage to PGA 1472. Buffer 1468 can drive PIN2 with a reference voltage Vref. Reference voltage Vref is provided to PGA 1472. An output of PGA 1472 can be provided as an input to SAR ADC 406, track/hold circuit 1496 and a (+) input to comparator 1478.

Track/hold circuit 1496 can sample and hold an output of PGA 1472, and provide it as a (−) input to comparator 1478. Operations of track/hold circuit 1496 and comparator 1478 can be controlled according to outputs of LUT 1498. An output of comparator 1478 can provide the read data.

The solid lines of FIG. 14 show connections for one configuration of the signal path 1422. Due to the flexibility in switching and routing, alternate signal paths are easily realized. Dashed lines 1421 and 1423 and "X"s 1425 show an alternate configuration for signal path 1422. Dashed lines (1421 and 1423) represent alternative signal routing added in the alternate configurations, and "X"s 1425 show signal paths removed in the alternative signal routing.

In this way, routing of one configuration can be dynamically modified by control signals received from a control circuit, including but not limited to, a processor (e.g., CPU DMA), sequencing logic, or via a DSI. Such a capability can enable switching between application types/configurations on the fly, or in response to a system event.

Figure 15:
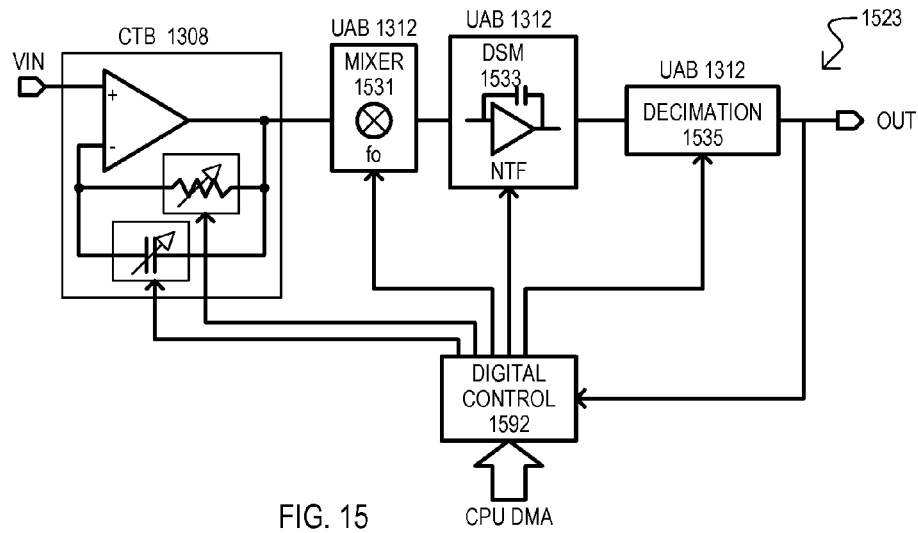
FIG. 15 is a block schematic diagram of an arbitrary mixed signal processing that can be realized by IC devices according to embodiments.

FIG. 15 shows an example of an arbitrary mixed signal processing that can be realized by IC devices as described herein. Signal path 1523 can include a gain/filter stage 1537 configured within a CT block 1308, a mixer 1531 configured within a UAB 1312, a sigma-delta modulation (DSM) stage 1533 configured within a UAB 1312, and a decimation stage 1535 configured within a UAB 1312. Each stage (1537, 1531, 1533, 1535) of the signal path 1523 can be controlled by a digital control section 1592.

According to embodiments, by operation of digital control section 1304, gain/filter stage 1537 can be adjusted dynamically prior to mixing the gained input in mixer 1531. Further, digital control section 1304 can vary transfer coefficients to modify the gain, order, signal transfer function (STF), signal-to-quantization noise ratio (SQNR), or noise transfer function (NTF) within the DSM stage 1533. An output of DSM stage 1533 can be processed in decimation stage 1535, whose behavior can also controlled on the fly, changing order or just coefficients of a decimation operation, for example.

Digital control section 1592 can be any suitable digital circuit, but in particular embodiments can be a local computation engine (local to the PASS) or UDBs (which can include some programmable digital logic) or a processor (e.g., microcontroller, CPU) with or without DMA. A net transfer function provided by signal path 1523 can have both linear and non-linear transfer characteristics, and further such characteristics can be varied in time.

Figure 16:
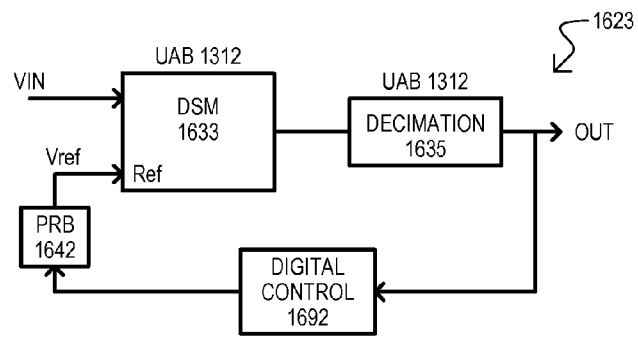
FIG. 16 is a block schematic diagram of additional arbitrary mixed signal processing that can be realized by IC devices according to embodiments.

FIG. 16 shows an example of another arbitrary mixed signal processing that can be realized by IC devices as described herein. In the embodiment shown, a digital control section can be incorporated into the processing loop to enable a wide variety of operations. Signal path 1623 can include a DSM stage 1633 having an output connected to a decimation stage 1635. A decimation stage output can be fed back to a digital control section 1692. In response to the output, digital control section 1692 can vary a reference value provided by a PRB 1642 to the DSM stage 1633.

Digital control section 1692 can adjust a reference voltage from PRB 1642. A digital control section 1692 can be programmed to perform gain control for maximizing dynamic range. A digital control section 1692 can also be programmed for other functions, including but not limited to: dynamic modulation of a reference voltage provided by a PRB 1642 to perform a mixing type function or to deliberate distort conversion of the input for demodulation.

Inclusion of digital control circuits into the processing paths implemented within a PASS can further include, but are not limited to: modification of a reference voltage from a PRB 1642 to change a DAC gain; modify clocking to allow multi sample and interleaved sampling; modify clocking to change sampling frequency; modify amplifier operations in a CT block, such as amplifier gain or bandwidth (through power level and compensation), and connections to the amplifier (pos gain, inverting gain, etc.); dynamically alter UAB topology between its different possible functions; changing analog routing to take advantage of inherent filtering of that route; modifying settings of fixed function blocks such as a SAR ADC to change aperture, sample rate, power level, SAR state machine transitions, SAR ADC sampling sequencer settings for example.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An integrated circuit (IC) device, comprising:
a plurality of analog blocks, including
at least one fixed function analog circuit, and
a plurality of reconfigurable analog circuit blocks;
at least one analog routing block reconfigurable to provide signal paths between any of the analog blocks; and
a digital section comprising digital circuits, wherein each analog block includes dedicated signal lines coupled to the at least one analog routing block and at least one of the reconfigurable analog circuit blocks includes at least one direct signal line coupling the at least one of the reconfigurable analog circuit blocks to an external connection of the IC device without passing through any switch, wherein at least one of the analog blocks comprises a programmable reference block (PRB) configured to generate at least four programmable reference values.

2. The IC device of claim 1, wherein:
the PRB has a direct connection for each of its reference values to a plurality of the other analog blocks.

3. The IC device of claim 1, further including:
each of the reconfigurable analog circuits is configurable, at least in part, in response to at least one corresponding digital control signal; and
a digital control section configured to generate the digital control signals.

4. The IC device of claim 3, further including:
a processor circuit; and
the digital control section generates the digital control signals in response to output data from the processor.

5. The IC device of claim 1, wherein:
the plurality of reconfigurable analog circuit blocks includes
at least one continuous time (CT) block comprising a plurality of reconfigurable amplifier circuits, and
at least one discrete time block comprising amplifiers with a reconfigurable switch network having groups of switches commonly controlled by different clock inputs.

6. An integrated circuit (IC) device, comprising:
at least one reconfigurable analog routing signal fabric;
a plurality of analog blocks, including
at least one fixed function analog circuit with dedicated signal lines connected to the analog routing signal fabric,
a plurality of reconfigurable analog circuit blocks with dedicated signal lines connected to the analog routing signal fabric, wherein at least one of the plurality of reconfigurable analog circuit blocks includes at least one direct signal line coupling the at least one of the plurality of reconfigurable analog circuit blocks to an external connection of the IC device without passing through any switch, and wherein at least one of the reconfigurable analog blocks comprises a programmable reference block (PRB) configured to generate at least four programmable reference values; and
a digital section comprising digital circuits.

7. The IC device of claim 6, wherein:
the reconfigurable analog routing signal fabric comprises shielded signal lines.

8. The IC device of claim 7, wherein:
the shielded signal lines include first signal lines formed from one conductive layer, and shielding signals lines formed of the one conductive layer and formed between the first signal lines and electrically coupled to one another.

9. The IC device of claim 8, wherein:
the shielded signal lines further include a shielding conductive layer at a different vertical layer than the one conductive layer, formed over the first signal lines and shielding signal lines and electrically coupled to the shielding signal lines.

10. The IC device of claim 6, wherein:
the fixed function analog circuit includes an analog-to-digital converter (ADC) circuit.

11. The IC device of claim 6, wherein:
the plurality of reconfigurable analog circuit blocks includes
at least one continuous time (CT) block comprising a plurality of reconfigurable amplifier circuits, and
at least one discrete time block comprising amplifiers with a reconfigurable switch network having groups of switches commonly controlled by different clock inputs.

12. A method, comprising:
in response to digital configuration signals, interconnecting a plurality of analog blocks with a reconfigurable analog signal routing fabric, the analog blocks including
at least one fixed function analog circuit with dedicated signal lines connected to the analog signal routing fabric, and
a plurality of reconfigurable analog circuit blocks with dedicated signal lines connected to the analog signal routing fabric, wherein at least one of the plurality of reconfigurable analog circuit blocks includes at least one direct signal line coupling the at least one of the plurality of reconfigurable analog circuit blocks to an external connection of the IC device without passing through any switch, and wherein at least one of the reconfigurable analog blocks comprises a programmable reference block (PRB) configured to generate at least four programmable reference values; and
generating the digital configuration signal with a digital section comprising digital circuits.

13. The method of claim 12, further including:
at least one of the reconfigurable analog circuit blocks is a continuous time block (CTB) comprising a plurality of reconfigurable amplifier circuits; and
executing continuous time signal processing in the at least one CTB block.

14. The method of claim 12, further including:
at least one of the reconfigurable analog circuit blocks comprises a discrete time block having amplifiers with a reconfigurable switch network having groups of switches commonly controlled by different clock inputs; and
executing discrete time signal processing in the discrete time block.

15. The method of claim 12, further including:
generating at least some of the digital configuration signals in response to a processor.

16. The method of claim 12, further including:
generating at least some of the digital configuration signals in response to reconfigurable digital circuits.

17. The method of claim 12, further including:
providing the at least four reference values directly to a plurality of the analog blocks from the programmable reference block.

* * * * *